(12) United States Patent
Tedeschi (10) Patent No.: US 11,348,846 B2
(45) Date of Patent: May 31, 2022

(54) WAFER PROCESSING TOOL HAVING A MICRO SENSOR

(71) Applicant: Applied Materials, Inc., Santa Clara, CA (US)

(72) Inventor: Leonard Tedeschi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/026,025

(22) Filed: Sep. 18, 2020

(65) Prior Publication Data

US 2021/0005521 A1 Jan. 7, 2021

Related U.S. Application Data

(62) Division of application No. 15/068,464, filed on Mar. 11, 2016, now Pat. No. 10,818,564.

(51) Int. Cl.
*H01L 21/02* (2006.01)
*H01L 21/66* (2006.01)
*C23C 16/52* (2006.01)

(52) U.S. Cl.
CPC ............. *H01L 22/26* (2013.01); *C23C 16/52* (2013.01); *H01L 21/0262* (2013.01); *H01L 22/12* (2013.01)

(58) Field of Classification Search
CPC ..... H01L 22/26; H01L 21/0262; H01L 22/12; C23C 16/52
See application file for complete search history.

(56) References Cited

U.S. PATENT DOCUMENTS

| 6,165,312 A | 12/2000 | Smith, Jr. et al. |
| 8,354,876 B1 | 1/2013 | Hassibi et al. |
| 2004/0119468 A1* | 6/2004 | Gotkis ............... H01L 22/26 324/230 |
| 2004/0214435 A1* | 10/2004 | Yuasa ............... H01J 37/32935 438/689 |
| 2005/0185171 A1* | 8/2005 | Samukawa ....... H01J 37/32963 356/237.1 |

(Continued)

FOREIGN PATENT DOCUMENTS

| JP | S63-55535 | 4/1988 |
| JP | S64-66937 | 3/1989 |

(Continued)

OTHER PUBLICATIONS

Decision of Rejection from Japanese Patent Application No. 2018-547946 dated Jun. 29, 2021, 6 pgs.

(Continued)

*Primary Examiner* — Mohammad M Choudhry
(74) *Attorney, Agent, or Firm* — Schwabe, Williamson & Wyatt, P.C.

(57) ABSTRACT

Embodiments include devices and methods for detecting material deposition and material removal performed by a wafer processing tool. In an embodiment, one or more micro sensors mounted on a process chamber of the wafer processing tool are capable of operating under vacuum conditions and/or may measure material deposition and removal rates in real-time during a plasma-less wafer fabrication process. Other embodiments are also described and claimed.

16 Claims, 7 Drawing Sheets

(56) References Cited

U.S. PATENT DOCUMENTS

| | | | | |
|---|---|---|---|---|
| 2005/0227378 | A1* | 10/2005 | Moise | H01L 27/10814 438/3 |
| 2006/0191865 | A1* | 8/2006 | Nishimura | H01L 27/14683 216/58 |
| 2008/0134757 | A1* | 6/2008 | Chen | C23C 16/4405 73/25.05 |
| 2008/0239314 | A1 | 10/2008 | Bonciolini et al. | |
| 2010/0164534 | A1* | 7/2010 | Rozenfeld | G01T 1/026 324/762.02 |
| 2010/0187094 | A1 | 7/2010 | Masato | |
| 2010/0219494 | A1* | 9/2010 | Barnaby | H01L 28/40 257/429 |
| 2012/0185813 | A1 | 7/2012 | Sanjeev | |
| 2014/0165747 | A1 | 6/2014 | Choi | |

FOREIGN PATENT DOCUMENTS

| | | |
|---|---|---|
| JP | 2004-241706 | 8/2004 |
| JP | 2006-344745 | 12/2006 |
| JP | 2012-046780 | 3/2012 |
| KR | 10-20040053592 | 6/2004 |
| KR | 10-1340425 | 12/2013 |
| TW | 2009-20862 | 5/2009 |
| WO | WO 2009/038085 | 1/2011 |
| WO | WO 2010/038631 | 3/2012 |
| WO | WO 2015-182090 | 12/2015 |

OTHER PUBLICATIONS

International Search Report and Written Opinion for PCT/US2017/014176 dated Apr. 21, 2017, 13 pgs.
Non-Final Office Action from U.S. Appl. No. 15/068,464 dated Nov. 2, 2017, 16 pgs.
Final Office Action from U.S. Appl. No. 15/068,464 dated Jun. 14, 2018, 15 pgs.
International Preliminary Report on Patentability from PCT/US2017/014176 dated Sep. 20, 2018, 10 pgs.
Non-Final Office Action from U.S. Appl. No. 15/068,464 dated Dec. 31, 2018, 13 pgs.
Final Office Action from U.S. Appl. No. 15/068,464 dated Jul. 25, 2019, 11 pgs.
Non-Final Office Action from U.S. Appl. No. 15/068,464 dated Nov. 29, 2019, 10 pgs.
Official Letter from Taiwanese Patent Application No. 106102359 dated Jun. 29, 2020, 17 pgs.
Notice of Reasons for Rejection from Japanese Patent Application No. 2018-547946 dated Jan. 15, 2021, 12 pgs.

* cited by examiner

WAFER PROCESSING TOOL HAVING A MICRO SENSOR

CROSS-REFERENCE TO RELATED APPLICATIONS

This application is a divisional of U.S. patent application Ser. No. 15/068,464, filed on Mar. 11, 2016, the entire contents of which are hereby incorporated by reference herein.

BACKGROUND

1) Field

Embodiments relate to the field of semiconductor processing and, in particular, to devices and methods for measuring material deposition or material removal in a wafer processing tool.

2) Description of Related Art

The manufacture of semiconductor devices involves the deposition and removal of material, and more particularly semiconductor material, on a substrate. Such deposition and removal is performed in a wafer processing tool using, e.g., deposition or etching processes. To accurately deposit or remove a specified amount of semiconductor material, film thickness measurement techniques may be used. For example, material deposition and material removal rates may be indirectly measured by processing a wafer of semiconductor material for a given amount of time, and then measuring an amount of film deposited or removed using an ellipsometer. Furthermore, sensors have been used to measure secondary factors that correlate with deposition/removal rates to indirectly estimate deposition/removal rates during a wafer fabrication process.

SUMMARY

Embodiments include a wafer processing tool having micro sensors, e.g., sensors sized on a MEMS-scale and/or fabricated using MEMS processes, to detect an amount or rate of material deposition or removal. In an embodiment, the wafer processing tool includes a process chamber having a chamber volume, and a micro sensor mounted on the process chamber at a predetermined location within the chamber volume. The micro sensor may have a parameter and include a sensor surface. Furthermore, the parameter may change when material is deposited on, or removed from, the sensor surface.

The micro sensor may be mounted on the process chamber at various locations. For example, the process chamber may include a chamber wall around the chamber volume, and the micro sensor may be mounted on the chamber wall. Alternatively, the process chamber may include a wafer holder having a holding surface, and the micro sensor may be mounted on the holding surface.

In an embodiment, the micro sensors may simulate a wafer of semiconductor material processed by the wafer processing tool. For example, the chamber volume of the wafer processing tool may be sized to receive the wafer, and the sensor surface of the micro sensor may also include the semiconductor material. Accordingly, the material deposited on or removed from both the wafer and the sensor surface may be the semiconductor material.

The micro sensor of the wafer processing tool may be any of several micro sensor types. For example, the micro sensor may include a micro-resonator. Accordingly, the parameter may be a characteristic frequency of the micro-resonator, and the characteristic frequency may shift in response to the material being deposited on or removed from the sensor surface. Alternatively, the micro sensor may include a transistor sensor having a MOSFET electrically coupled to a collector. Accordingly, the parameter may be a threshold voltage of the MOSFET, and the threshold voltage may change in response to the material being deposited on or removed from the sensor surface on the collector.

In an embodiment, the wafer processing tool is part of a wafer processing system. That is, the wafer processing system may include the wafer processing tool and a computer system communicatively coupled to the wafer processing tool. Accordingly, the computer system may receive input signal(s) from one or more micro sensors corresponding to respective parameters of the micro sensors, and/or from a measurement instrument used to measure a process parameter of a wafer fabrication process. The computer system may be configured to measure or control the wafer fabrication process based on the input signal(s). For example, the computer system may determine an endpoint of the wafer fabrication process based on the input signal from the micro sensor. Alternatively, the computer system may determine a uniformity of the wafer fabrication process based on the input signals. Furthermore, the computer system may determine a root cause of a change of the wafer fabrication process based on the measured parameter of the micro sensor and the process parameter of the wafer fabrication process.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Devices and methods used to detect material deposition or material removal performed by a wafer processing tool are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Existing techniques for measuring material deposition and removal either do not provide real-time measurement and control of a wafer fabrication process, or provide an estimate of material deposition/removal based on correlation to a secondary factor rather than measuring the deposition/removal directly. For example, an ellipsometer may be used to measure film thickness, however, since the ellipsometer is a periodic monitor, the ellipsometer cannot detect real-time excursions or drifts in the deposition/removal rate for normal production runs. Furthermore, sensors installed in a process chamber of a wafer processing tool to measure secondary factors, such as RF match positions or gas concentrations in a plasma, do not directly measure the variable of concern (deposition/removal rates) and such measurements become more challenging in chambers that do not have a plasma.

In an aspect, a wafer processing system includes a micro sensor mounted on a process chamber of a wafer processing tool to measure material deposition or material removal in all pressure regimes, e.g., under vacuum conditions, and under plasma-less conditions. The micro sensor mounted on the process chamber may include a sensor surface, and a parameter of the micro sensor may change when material is deposited on or removed from the sensor surface. Thus, real-time measurement of material deposition or removal amounts or rates, as well as uniformity of such amounts or rates, may be monitored and used to control a wafer fabrication process performed by the wafer processing system.

It will be understood that the wafer processing systems and methods described below could be used in any form factor or process where materials are deposited or removed from a substrate. More particularly, although the wafer processing systems and methods are described with respect to wafer processing for the fabrication of integrated circuits, the devices and methods may also be adapted for use in other technologies, such as displays in the electronics industry and/or photovoltaic cells in the solar industry.

Figure 1:
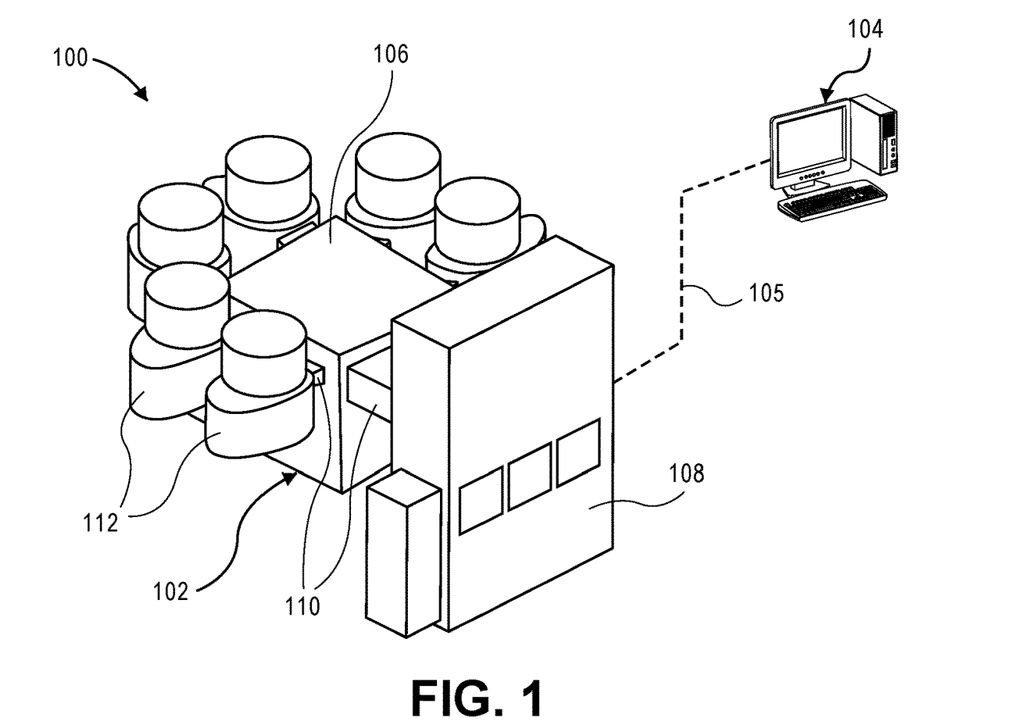
FIG. 1 is an illustration of a wafer processing system, in accordance with an embodiment.

Referring to FIG. 1, an illustration of a wafer processing system is shown in accordance with an embodiment. A wafer processing system 100 may include a wafer processing tool 102 communicatively coupled to a computer system 104 by a communication link 105. Communication link 105 may be a wired or wireless connection, i.e., wafer processing tool 102 may communicate directly or wirelessly with computer system 104.

Wafer processing tool 102 may include a buffer chamber 106 physically connected to a factory interface 108 by one or more load locks 110. Furthermore, one or more process chambers 112 may be physically connected to buffer chamber 106 by one or more respective load locks 110. Buffer chamber 106 may act as an intermediate volume, larger than respective volumes of process chambers 112, that remains at a low pressure, albeit at a pressure higher than the process pressures within process chambers 112. Thus, a semiconductor wafer, e.g., a silicon wafer, may be moved between chambers 106, 112 of wafer processing tool 102 under vacuum conditions during the manufacture of semiconductor devices. This movement may be enabled by various devices included in the wafer processing tool 102, e.g., robotic arms, shuttles, etc.

Various manufacturing operations may be performed in process chambers 112. For example, at least one process chamber 112 may be an etch chamber, a deposition chamber, a chamber of a semiconductor lithography tool, or any other semiconductor processing chamber. As such, process chamber 112 may be used to perform wafer fabrication processes under vacuum conditions, atmospheric conditions, or any other pressure regime.

In addition to varying pressure regimes, process chambers 112 may also be used to perform manufacturing processes having different energetic conditions. For example, process chamber 112 may be a radical-driven etch chamber or a deposition chamber that does not include a plasma. That is, process chamber 112 may be plasma-less during a wafer fabrication process.

Figure 2:
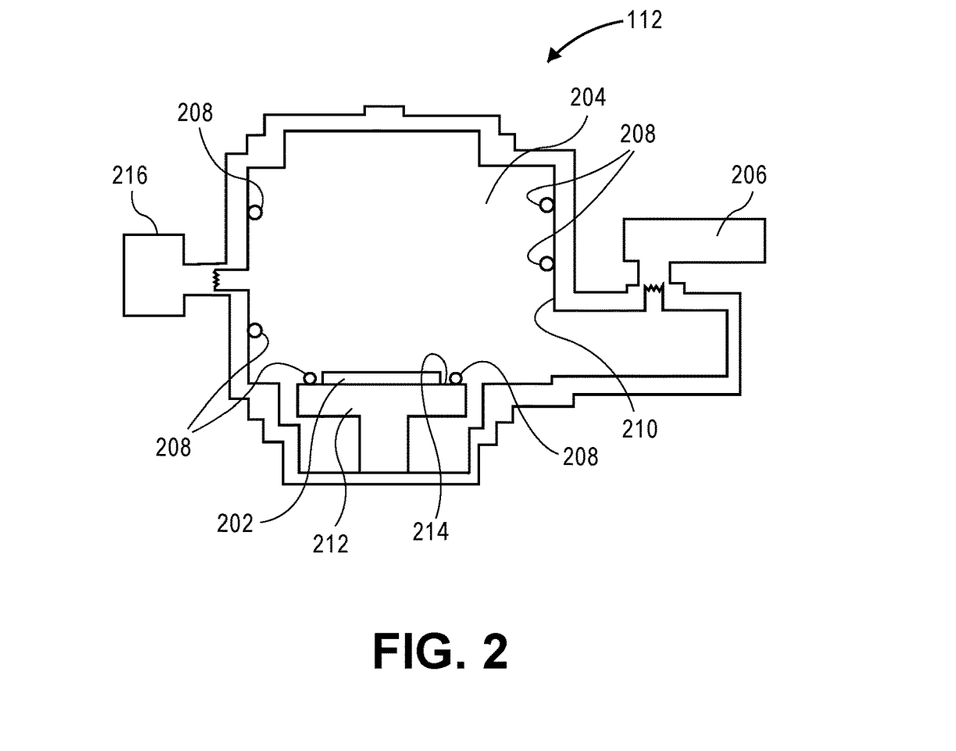
FIG. 2 is a sectional illustration of a micro sensor mounted on a process chamber of a wafer processing tool, in accordance with an embodiment.

Referring to FIG. 2, a sectional illustration of a micro sensor mounted on a process chamber of a wafer processing tool is shown in accordance with an embodiment. A wafer 202, e.g., a wafer of semiconductor material, may be subjected to a wafer fabrication process in process chamber 112 of wafer processing tool 102. Wafer 202 may experience different pressure conditions as the wafer moves through wafer processing tool 102. For example, the semiconductor wafer may be inserted into the factory interface 108 at atmospheric conditions. Then, as the semiconductor wafer goes into a load lock 110 between factory interface 108 and buffer chamber 106, the load lock 110 may be brought to a vacuum condition of 120 millitorr. The semiconductor wafer may then pass from the load lock 110 into buffer chamber 106, having a buffer chamber 106 pressure of 100 millitorr.

Wafer 202 may be transferred from buffer chamber 106 into one of the process chambers 112 through load lock 110. For example, process chamber 112 may include a chamber volume 204 sized to receive wafer 202. Thus, semiconductor material may be deposited on or removed from wafer 202 during a wafer fabrication process within process chamber 112. During the wafer fabrication process, chamber volume 204 of process chamber 112 may have a chamber pressure that is lowered to a vacuum condition using, e.g., a vacuum source 206 such as a vacuum pump and/or turbo pump. In the context of this description, a vacuum condition may be any pressure less than 0.5 atm. In an embodiment, the vacuum condition in process chamber 112 exists when process chamber 112 has a chamber pressure less than the pressure of buffer chamber 106, e.g., less than 100 millitorr. Accordingly, the process chamber 112 may be under vacuum conditions during the manufacturing operation of the wafer fabrication process. Furthermore, the vacuum conditions may reduce or eliminate gaseous mixtures from chamber volume 204, and thus, chamber volume 204 may be plasmaless during the wafer fabrication process.

One or more micro sensors 208 may be mounted on process chamber 112 within chamber volume 204. For example, chamber volume 204 may be at least partly defined by a chamber wall 210 around chamber volume 204, and several micro sensors 208 may be mounted at predetermined locations on chamber wall 210 within chamber volume 204.

As used herein, the term "micro" may refer to the descriptive size of certain sensors or structures in accordance with embodiments. For example, the term "micro sensor" may refer to a sensor having dimensions on the scale of 1 to 100 μm. That is, in an embodiment, micro sensor 208 may have a sensor surface described below that includes a maximum width of 1 to 100 μm. Accordingly, micro sensors 208 as described herein are readily distinguishable from, e.g., microbalances, which are instruments capable of making precise measurements of weight on the order of a million parts of a gram. That is, microbalances may measure weight on a micro-scale, but are not within the same size range of the micro sensors described herein. This difference in size range is advantageous at least because several micro sensors may be fit into chamber volume 204, whereas several microbalances may not fit into chamber volume 204 that is sized to receive a semiconductor wafer.

As used herein, the term "micro sensors" may also refer to sensors that are fabricated using materials and manufacturing processes pertinent to microelectromechanical systems (MEMS). That is, micro sensors 208 described herein may be fabricated using MEMS processes such as deposition processes, patterning, etching, etc. Accordingly, micro sensors 208 may be MEMS-scale sensors having a size and structure formed using MEMS processes. It is to be appreciated, however, that embodiments are not necessarily so limited, and that certain aspects of the embodiments may be applicable to larger, and possibly smaller size scales.

While as few as one micro sensor 208 may be mounted on process chamber 112, numerous micro sensors 208, e.g., hundreds to millions of micro sensors 208, may be fit into chamber volume 204. That is, given the MEMS-scale size of micro sensors 208 described above, many micro sensors 208 may be distributed along chamber wall 210 (or other components of process chamber 112) to monitor a deposition/removal of semiconductor material within process chamber 112 in real-time.

Each micro sensor 208 may have a known location. For example, a first micro sensor 208 may be located at a first predetermined location within chamber volume 204, and a second micro sensor 208 may be located at a second predetermined location within chamber volume 204. Micro sensors 208 may be distributed on process chamber 112 randomly or in a predetermined pattern. For example, the second location may have a known position relative to the first location, or relative to some other reference point on process chamber 112. Thus, uniformity of material deposition/removal may be determined as described below, by comparing real-time measurements from the first micro sensor 208 and the second micro sensor 208.

In an embodiment, micro sensor(s) are mounted on portions of process chamber 112 other than chamber wall 210. For example, instead of or in addition to having micro sensors 208 mounted on chamber wall 210, one or more micro sensors 208 may be mounted on a wafer holder 212 within process chamber 112. Wafer holder 212 may be, for example, an electrostatic chuck having electrode(s) to electrostatically clamp wafer 202 during a wafer fabrication process. Wafer holder 212 may include a holding surface 214 upon which wafer 202 is clamped. For example, holding surface 214 may be a layer of dielectric material over wafer holder 212, and micro sensor 208 may be mounted on holding surface 214. More particularly, micro sensors 208 may be mounted on holding surface 214 in a region near and/or laterally offset from wafer 202 during the wafer fabrication process. For example, a process kit may include a ring around wafer 202 on holding surface 214, and micro sensor 208 may be mounted on process kit.

It is contemplated that micro sensors 208 may be located in process chamber 112 or built into consumable or non-consumable parts of process chamber 112, e.g., wafer holder 212, within close enough proximity to wafer 202 to detect changes in material deposition or removal rates of wafer 202. For example, wafer 202 may have a forward-facing surface, i.e., a surface facing away from holding surface 214, and micro sensor 208 may be mounted on holding surface 214 such that a sensor surface sensitive to material deposition/removal is also facing forward.

Wafer processing tool 102 may include other sensors and/or measurement instruments to detect a process parameter of the wafer fabrication process. The other sensors and/or measurement instruments may not be micro sensors. For example, in contrast to MEMS-scale sensors described below, wafer processing tool 102 may include an optical spectrometer 216 mounted on process chamber 112 or otherwise mounted to detect an optical emissions spectrometry (OES) signature of chamber volume 204 during the wafer fabrication process. The OES signature may identify a type and amount of elements within chamber volume 204. For example, the OES signature may identify what chemical elements are present in a plasma within chamber volume 204 during the wafer fabrication process. Other sensors may be used to detect other process parameters of the wafer fabrication process performed in chamber volume 204. Such other sensors may include electrical sensors to measure power delivered to process chamber 112 or wafer 202, electrical sensors to measure electrical characteristics of wafer holder 212, etc. Such sensors may not measure an actual amount or rate of deposition/removal of semiconductor material, but may nonetheless be correlated to actual deposition/removal measurements made by micro sensors 208 for the reasons described below.

Micro sensors 208 and/or measurement instruments of wafer processing tool 102 may be interconnected with each other or other circuitry through one or more electrical connector. For example, micro sensors 208 may be connected in series by an electrical trace running over chamber wall 210 and/or wafer holder 212. Alternatively or in addition, several micro sensors 208 may be electrically connected in parallel by respective electrical traces. Thus, electrical connections may be made between micro sensors 208 and/or micro sensors 208 may be connected to electronic circuitry, using electrical traces, electrical leads, vias, and other known types of electrical connectors.

Figure 3:
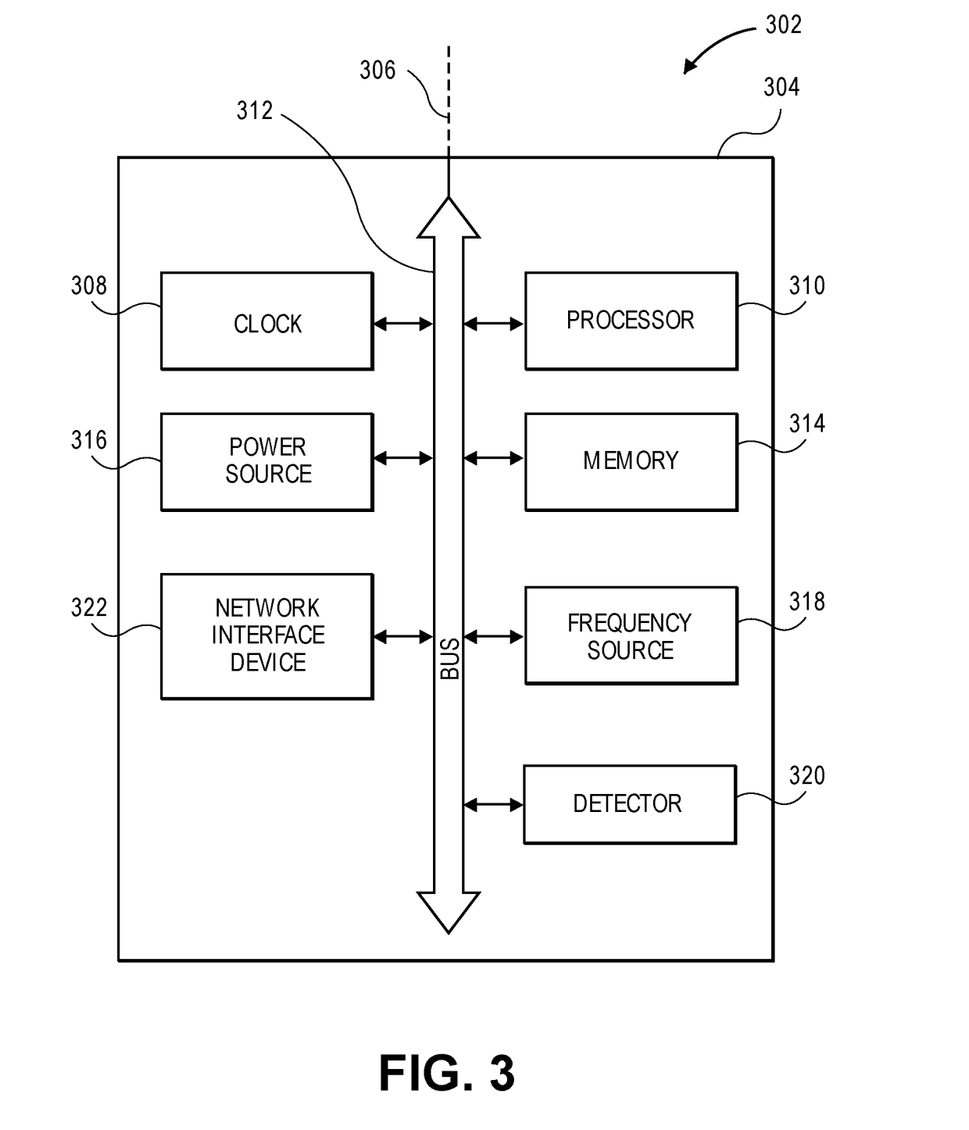
FIG. 3 is an illustration of a block diagram of electronic circuitry communicatively coupled to a micro sensor, in accordance with an embodiment.

Referring to FIG. 3, an illustration of a block diagram of electronic circuitry communicatively coupled to a micro sensor is shown in accordance with an embodiment. Each micro sensor 208 of wafer processing tool 102 may have a parameter that changes when a material is deposited on or removed from a sensor surface, as described below. Furthermore, micro sensor 208 may be configured to sense the change. More particularly, the parameter of the micro sensor 208 may change when the micro sensor 208 receives a material particle within process chamber 112 of wafer processing tool 102. Here, the term "receives" indicates an interaction between the material and micro sensor 208 that affects the given parameter. For example, the parameter may be a voltage, a current, or another physical or electrical characteristic of micro sensor 208 that changes when a material particle lands on or evaporates from the sensor surface of micro sensor 208. Other material-to-sensor interactions will be understood by a skilled artisan when reading this description.

Electronic circuitry 302 of wafer processing tool 102 may be enclosed or supported in a housing 304. Housing 304 and/or electronic components of electronic circuitry 302 may be mounted on process chamber 112, e.g., on chamber wall 210 or wafer holder 212. Similarly, housing 304 may be mounted on another portion of wafer processing tool 102, e.g., on an external surface outside of chamber volume 204. Accordingly, electronic circuitry 302 may be co-located or remotely placed relative to micro sensor 208. Electronic circuitry 302 may nonetheless be placed in electrical connection with micro sensor 208 through one or more input/output (I/O) connection 306, e.g., an electrical trace, electrical lead, or via, even when mounted remotely relative to the micro sensor 208.

Electronic circuitry 302 of wafer processing tool 102 may include a clock 308. Clock 308 may be an electronic circuit having an electronic oscillator, e.g., a quartz crystal, to output an electrical signal having a precise frequency, as is known in the art. Thus, clock 308 may be configured to output a time value corresponding to an electrical signal received through I/O connection 306. The time value may be an absolute time value independent of other operations, or the time value may be synchronized to other clocks in wafer processing tool 102. For example, clock 308 may be synchronized to a system clock of wafer processing tool 102, or a system clock of a host computer of a fabrication facility linked to wafer processing tool 102, such that the time value output by clock 308 corresponds to a system time value and/or system operations that are output or controlled by the system clock. Clock 308 may be configured to initiate the output of the time value when a particular process operation occurs. Electronic circuitry 302 of wafer processing tool 102 may include a network interface device 322 to transmit and receive communications between wafer processing tool 102 and the host computer.

Electronic circuitry 302 of wafer processing tool 102 may include a processor 310. Processor 310 may be operably coupled, e.g., electrically connected by a bus 312 and/or traces, to clock 308. Processor 310 represents one or more general-purpose processing devices such as a microprocessor, central processing unit, or the like. More particularly, processor 310 may be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processor 310 may also be one or more special-purpose processing devices such as an application specific integrated circuit (ASIC), a field programmable gate array (FPGA), a digital signal processor (DSP), network processor, or the like.

Processor 310 is configured to execute processing logic for performing the operations described herein. For example, processor 310 may be configured to receive and analyze input signals from several micro sensors 208 located at different predetermined locations within chamber volume 204. Processor 310 may also receive time value outputs from clock 308 corresponding to each received input signal. Accordingly, processor 310 may compare input signals from several micro sensors 208, e.g., to determine a uniformity of a wafer fabrication process at a given time. Processor 310 may be configured to determine other types of information based on signals received from micro sensors 208. For example, input signals received from one or more micro sensors 208 may be used to endpoint the wafer fabrication process or to determine a root cause of a change in the wafer fabrication process.

Monitoring of micro sensors 208 may be performed by processor 310 on an individual or group basis. That is, processor 310 may monitor and record individual data for each micro sensor 208. Accordingly, each micro sensor 208 may be individually identifiable, e.g., by a unique sensor identification number that is associated with location or other sensor-specific data. In an embodiment, micro sensors 208 may be monitored in groups. For example, processor 310 may monitor and record bank data for a group of one or more micro sensors 208. Accordingly, the group of micro sensors 208 may be associated with location or other group-specific data that corresponds to the group of sensors as a whole.

Electronic circuitry 302 of wafer processing tool 102 may include a memory 314 mounted on substrate. Memory 314 may include one or more of a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), or a secondary memory (e.g., a data storage device). Processor 310 may communicate with memory 314 via bus 312 or other electrical connection. Thus, processor 310 may be operably coupled to memory 314 to record the predetermined location of the triggered micro sensor 208 and the time value output by clock 308, in the memory 314. That is, memory 314 may log a time when a material is deposited on or removed from micro sensor 208, and a location where the affected micro sensor 208 is mounted on the process chamber 112.

Electronic circuitry 302 of wafer processing tool 102 may include a power source 316. Power source 316 may include a battery, a capacitor bank, or another known power supply. Power source 316 may be electrically connected to, and may power, one or more of the components of wafer processing tool 102 through bus 312, e.g., micro sensors 208, clock 308, processor 310, or memory 314.

Electronic circuitry 302 of wafer processing tool 102 may include additional components. For example, electronic circuitry 302 may include a frequency source 318, e.g., a broad frequency source, or a detector 320. Frequency source 318 and detector 320 may have particular application in relation to specific embodiments of micro sensors 208 of wafer processing tool 102. Thus, further description of frequency source 318 and detector 320 is reserved for the corresponding sensor discussion below. Various embodiments of micro sensors 208 are now described.

Figure 4A:
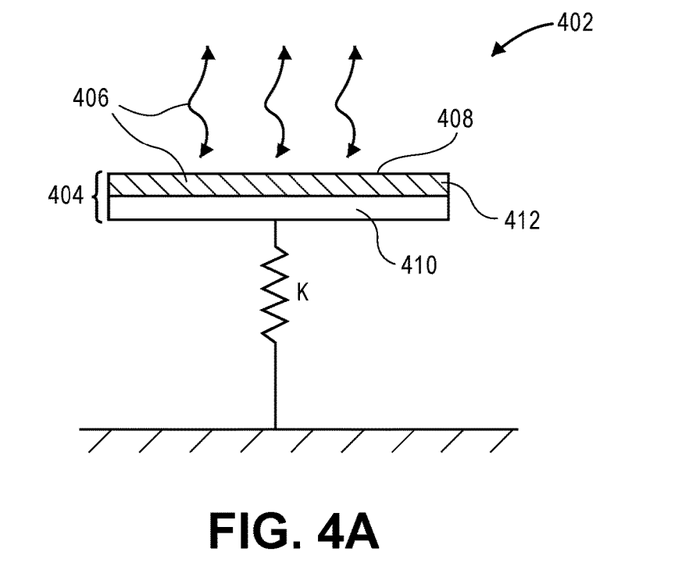
FIG. 4A-4B are schematic illustrations of a micro-resonator type of micro sensor of a wafer processing system, in accordance with an embodiment.

Referring to FIG. 4A, a schematic illustrations of a micro-resonator type of micro sensor of a wafer processing system is shown in accordance with an embodiment. In an embodiment, one or more micro sensors 208 of wafer processing tool 102 include a micro-resonator 402. Micro-resonator 402 may be a suitable resonant mass sensor, such as a Quartz Crystal Microbalance (QCM), Surface Acoustic Wave (SAW), or Film Bulk Acoustic Resonators (FBAR), which all quantify the cumulative mass of airborne particles deposited on their surfaces. A description of the complexity and variety of micro-resonators 402 is not described here in favor of a simplified description for the purpose of brevity and ease of understanding. The micro-resonator(s) may be distributed at predetermined locations on process chamber 112. Each micro-resonator 402 may have a characteristic frequency, e.g., a resonant frequency, as is known in the art. For example, without going into great detail, micro-resonator 402 may be represented by a simple mass-spring system as is shown in FIG. 4A. The characteristic frequency of micro-resonator 402 may be inversely proportional to a mass 404 of the micro-resonator system. For example, the characteristic frequency may be proportional to sqrt(k/M) of the micro-resonator system, where 'M' corresponds to mass 404 and 'k' corresponds to a proportionality constant of the micro-resonator system. Thus, it will be recognized that the characteristic frequency shifts when micro-resonator 402 receives or gives off a material 406, e.g., during a wafer fabrication process. More particularly, when material 406, e.g., semiconductor material, is deposited on or removed from a sensor surface 408 of micro-resonator 402 within process chamber 112 of wafer processing tool 102, mass 404 of micro-resonator 402 changes, and accordingly, the characteristic frequency shifts.

Sensor surface 408 of micro-resonator 402 may be an exposed surface, e.g., facing forward in a same direction as wafer 202. A portion of micro-resonator 402 having sensor surface 408, however, may include several layers. For example, micro-resonator 402 may include a base layer 410 under a top layer 412 having sensor surface 408. Base layer 410 and top layer 412 may include a same material. For example, base layer 410 and top layer 412 may be formed from a same silicon material. In an embodiment, base layer 410 is formed from a different material than top layer 412. For example, base layer 410 may be formed from a polymer, metal, or ceramic material micro-machined into a supporting structure, and top layer 412 may be formed from a silicon material and disposed on base layer 410. Thus, top layer 412 may cover a portion of base layer 410.

In an embodiment, sensor surface 408 includes material 406. More particularly, micro sensor 208 may include a sensor surface 408 formed from a same semiconductor material as material 406 deposited on or removed from wafer 202 during a wafer fabrication process. For example, when the wafer fabrication process is a deposition process to deposit silicon onto a silicon wafer, sensor surface 408 may include silicon to ensure that the deposited material 406 interacts with sensor surface 408 in a similar manner to the interaction with wafer 202. Similarly, when the wafer fabrication process is an etching process to remove silicon from the silicon wafer 202, sensor surface 408 may include silicon to ensure that material 406 is etched from sensor surface 408 at a similar rate to a removal rate of silicon from the silicon wafer 202. Accordingly, sensor surface 408 may simulate a surface of wafer 202 to measure an actual deposition rate or removal rate that is simultaneously occurring to wafer 202 during the wafer fabrication process.

Figure 4B:
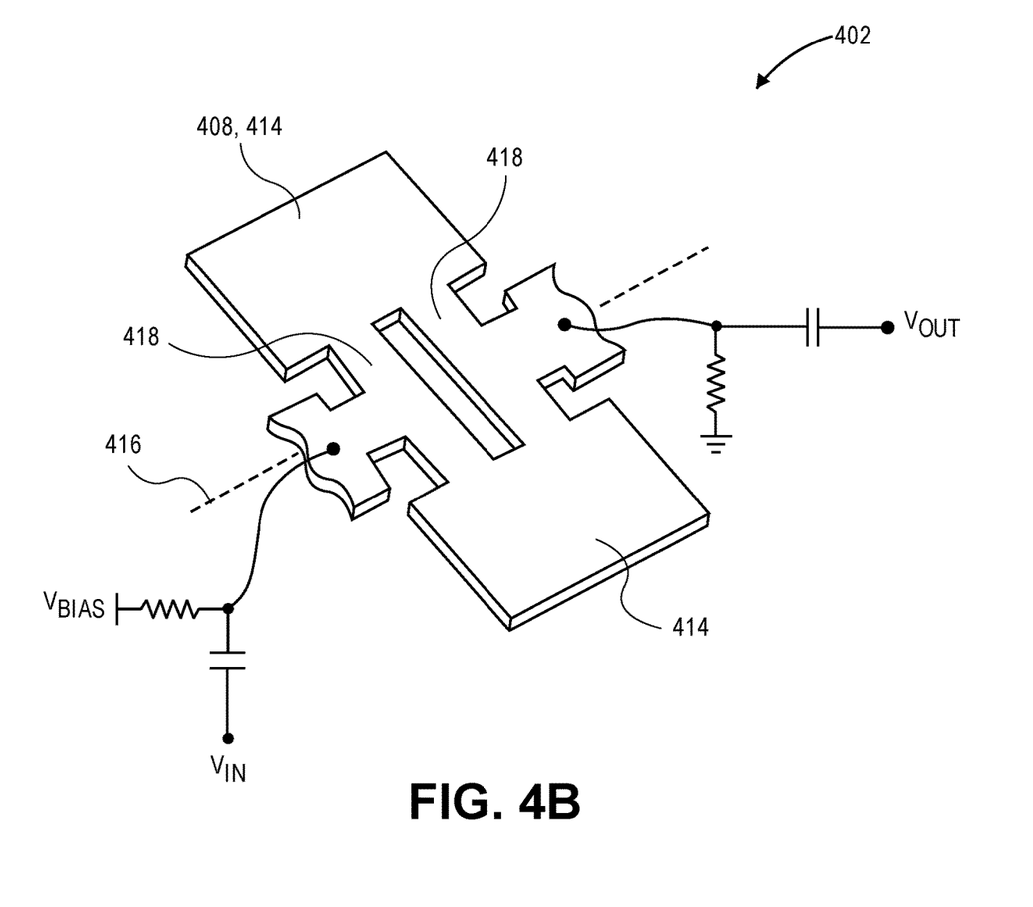

Referring to FIG. 4B, a schematic illustrations of a micro-resonator type of micro sensor of a wafer processing system is shown in accordance with an embodiment. A particular type of micro-resonator 402 that may be used as a micro sensor 208 is a MEMS resonant mass sensor, such as a thermally actuated high-frequency single crystalline silicon resonator. Such micro-resonators 402 may be fabricated as individual devices or arrays using single mask processes. Micro-resonator 402 may include two pads 414 on either side of a plane of symmetry 416. A fluctuating electrical current may be passed between the two pads 414 to cause an alternating current (AC) ohmic loss component in the current path. In an embodiment, most of the ohmic loss occurs in thin pillars 418 that interconnect the pads 414.

Thin pillars 418 may be centrally located and extend between the pads 414 in a direction orthogonal to plane of symmetry 416. Fluctuating temperature generated in pillars 418 may cause an AC force, and an alternating thermal stress in pillars 418, to actuate micro-resonator 402 in an in-plane resonant mode. In the in-plane resonant mode, pads 414 having mass 404, i.e., 'M', vibrate in opposite directions. Thus, at resonance, micro-resonator 402 includes a characteristic frequency of the vibrating pads 414, and a resistance of pillars 418 is modulated by an alternating mechanical stress due to a piezoresistive effect. Accordingly, there is a detectable small signal motional current in micro-resonator 402 corresponding to the characteristic frequency.

To detect a shift in the characteristic frequency of micro-resonator 402, frequency source 318 and detector 320 may be incorporated in electronic circuitry 302 of wafer processing tool 102. Frequency source 318 may be a broad frequency source 318 that is used to excite micro-resonator 402. Detector 320 may monitor the characteristic frequency of micro-resonator 402, and detect a shift of the characteristic frequency. For example, detector 320 may output a signal corresponding to the characteristic frequency, e.g., an output voltage or current, to processor 310. Processor 310 may be configured to receive the output voltage and recognize the shift of the characteristic frequency. Thus, when a change in the output voltage and/or when the characteristic frequency of micro-resonator 402 changes, wafer processing tool 102 can note the change as an instance of deposition or removal of material 406 from sensor surface 408 on pad 414 of micro-resonator 402. Deposition and removal may be logged over time to detect a rate of deposition and/or removal of material 406. As mass 404 of micro-resonator 402 increases or decreases, e.g., as material 406 accumulates on or evaporates from micro-resonator 402, the characteristic frequency will shift down, allowing wafer processing tool 102 to monitor and measure a deposition and/or removal rate of a wafer fabrication process in real-time.

Figure 5:
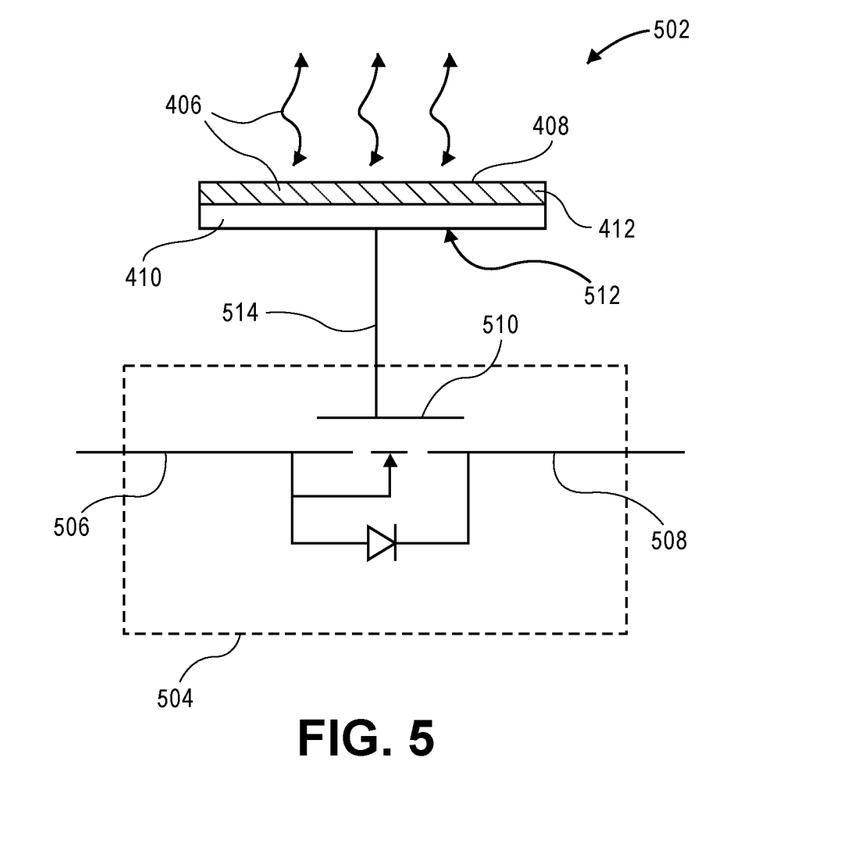
FIG. 5 is a schematic illustration of a transistor sensor type of micro sensor of a wafer processing system, in accordance with an embodiment.

Referring to FIG. 5, a schematic illustration of a transistor sensor type of micro sensor of a wafer processing system is shown in accordance with an embodiment. In an embodiment, one or more micro sensors 208 of wafer processing tool 102 include a transistor sensor 502. Transistor sensor 502 may include one or more transistor, e.g., a MOSFET 504. MOSFET 504 may include a source 506, a drain 508, and a gate 510. Transistor sensor 502 may also include a collector 512, similar to mass 404 described with respect to FIGS. 4A-4B, to receive or emit material 406 during a wafer fabrication process. Collector 512 may be physically separated from MOSFET 504, however, the subcomponents may be electrically connected with each other. For example, collector 512 may be electrically connected to gate 510 of MOSFET 504 through an electrical trace 514. Thus, MOSFET 504 may be configured to detect that material 406 has landed on or evaporated from collector 512 even when collector 512 is located at a predetermined location spaced apart from MOSFET 504.

Collector 512 may be sized and configured to receive material 406. For example, a typical size of material 406 particles may be in a range of 45 nanometers to 1 micron, and thus, collector 512 may include an outer profile having an outer rim with a diameter of at least 1 micron. A shape of the outer rim when viewed in a downward direction may be circular, rectangular, or any other shape. Furthermore, collector 512 may be flat, i.e., may have a planar sensor surface 408, or collector 512 may have a conical sensor surface 408. In an embodiment, collector 512 is not a separate structure from MOSFET 504, but instead, is incorporated into MOS- FET 504. For example, collector 512 may be a collection area on gate 510 of MOSFET 504.

Similar to micro-resonator 402 described above, collector 512 of transistor sensor 502 may include sensor surface 408 configured to simulate a surface of wafer 202. For example, transistor sensor 502 may be located near wafer 202, e.g., on holding surface 214, and sensor surface 408 may be oriented to face a forward direction parallel to a direction faced by a wafer surface. Collector 512 may include a multi-layer structure, e.g., having base layer 410 and top layer 412 of same or different material 406.

In an embodiment, a parameter of transistor sensor 502 corresponds to MOSFET 504. More particularly, the parameter of transistor sensor 502 may be a threshold voltage of MOSFET 504 as measured across gate 510. The threshold voltage may correspond directly to the presence or absence of material 406 on collector 512. For example, the threshold voltage may have a first value when a first amount of material 406 is on collector 512, and the threshold voltage may have a second value (different than the first value) when a second amount of material 406 is on collector 512. Thus, material 406 collected or emitted from sensor surface 408 of collector 512 may be determined based on the threshold voltage of transistor sensor 502. Processor 310 may be configured to detect a change in the threshold voltage, and thus, when a change in the threshold voltage is detected, wafer processing tool 102 can note the change as an amount of material deposition or removal. The threshold voltage may be logged over time to determine an actual deposition rate or removal rate of material 406 for wafer 202.

Figure 6:
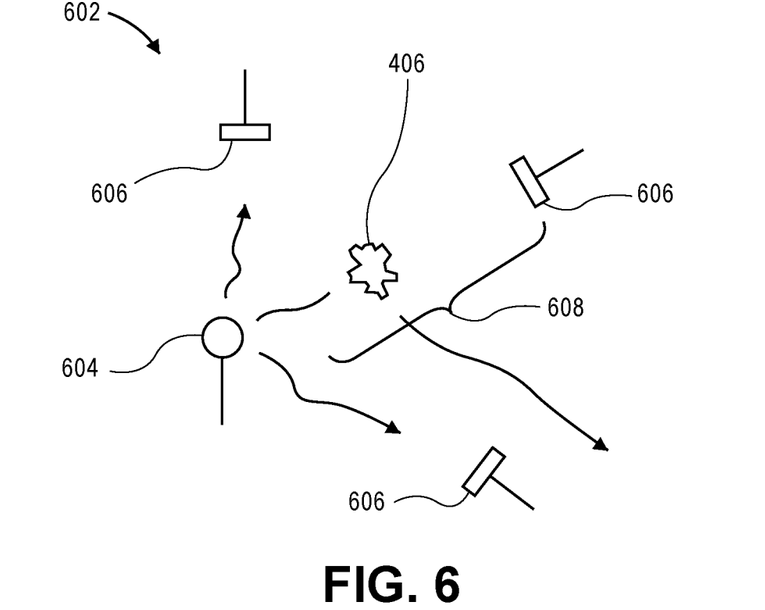
FIG. 6 is a schematic illustration of an optical sensor type of micro sensor of a wafer processing system, in accordance with an embodiment.

Referring to FIG. 6, a schematic illustration of an optical sensor type of micro sensor of a wafer processing system is shown in accordance with an embodiment. In an embodiment, one or more micro sensors 208 of wafer processing tool 102 include an optical sensor 602. Optical sensor 602 may be a Micro-Opto-Electro-Mechanical Systems (MOEMS) as is known in the art, and may be formed directly on a substrate using known semiconductor processing operations. A description of the complexity and variety of MOEMS is not described here in favor of a simplified description for the purpose of brevity and ease of understanding. Optical sensor 602 may include several micro mirrors or lenses distributed across the sensor surface 408 (not shown) of the substrate. Without going into great detail, optical sensor 602 may include an optical path 608 emanating from a light source 604. Optical path 608 may be between light source 604 and a light detector 606. In an embodiment, a parameter of optical sensor 602 corresponds to whether light is received from light source 604 at light detector 606. For example, the parameter may change in response to material 406 disturbing optical path 608. That is, when particles of material 406 pass through or rest in optical path 608 and block light between light source 604 and light detector 606, the parameter may change. In an embodiment, when particle passes through optical sensor 602, light from light source 604 is reflected along a different optical path 608 toward another light detector 606. Detection of the reflected light by the other light detector 606 may result in a change to the parameter of optical sensor 602. The parameter may be, for example, an output voltage of optical sensor 602 corresponding to light detection. Processor 310 may be configured to detect a change in the output voltage, and thus, when a change in the output voltage and/or when a disturbance in optical path 608 is detected, wafer processing tool 102 can note the change as a deposition or removal of material 406 from sensor surface 408 on the substrate, and thus, deposition/removal amounts and/or rates may be measured and monitored in real-time.

It will be appreciated that, since the micro sensors types described above operate on the basis of electrical parameters that are independent of external pressures, wafer processing tool 102 having one or more micro sensors 208 such as micro-resonator 402, transistor sensor 502, or optical sensor 602 may work at any pressure regime, including under vacuum conditions. Similarly, micro sensors 208 may operate regardless of a gaseous consistency of chamber volume 204, including under plasma-less conditions.

Wafer processing tool 102 having micro sensors 208 mounted on process chamber 112 may be used to monitor and control a wafer fabrication process. While not restrictive, several methods of performing such monitoring and control are described below. For brevity, operations in the methods described below may refer to monitoring of a micro-resonator 402, however, the methods may be adapted to incorporate other micro sensor types, such as those described above.

Figure 7:
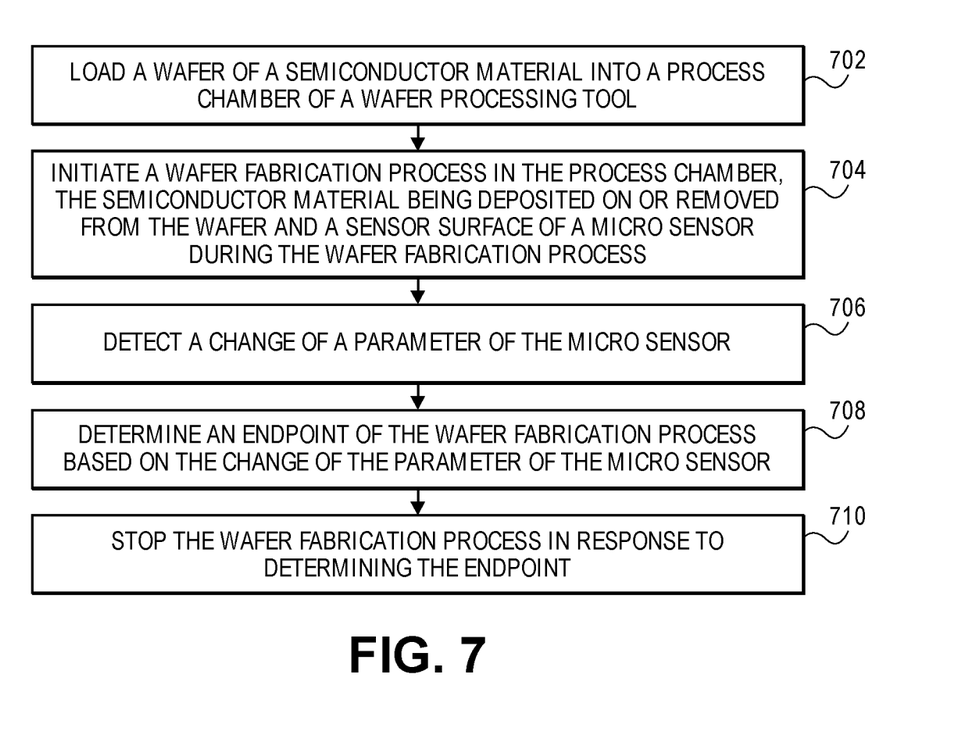
FIG. 7 is an illustration of a flowchart representing operations in a method of endpointing a wafer fabrication process, in accordance with an embodiment.

Referring to FIG. 7, an illustration of a flowchart representing operations in a method of endpointing a wafer fabrication process is shown in accordance with an embodiment. An endpoint of a wafer fabrication process may be detected in some cases by measuring a parameter of the process, e.g., a concentration of a particular element found in a plasma in process chamber 112, to determine whether a process operation has achieved a process goal and should be stopped. Such detection may be difficult or impossible using conventional sensors or measurement instruments, however, when chamber volume 204 is plasma-less. The below-described method of determining an endpoint using micro sensor 208, however, may be used under plasma-less conditions.

At operation 702, wafer 202 is loaded into process chamber 112 of wafer processing tool 102. Wafer 202 may be formed from a semiconductor material, and may be moved from a first chamber of wafer processing tool 102, e.g., buffer chamber 106, to a second chamber of wafer processing tool 102, e.g., process chamber 112. Accordingly, wafer 202 may be subjected to a wafer fabrication process, e.g., deposition or etching, inside chamber volume 204 of process chamber 112.

At operation 704, the wafer fabrication process may be initiated in process chamber 112. For example, a chamber pressure of the second chamber, e.g., process chamber 112, may be reduced to a vacuum condition. More particularly, the chamber pressure may be lowered below 0.5 atm. As described above, wafer processing tool 102 is capable of detecting material deposition/removal under all pressure regimes, and thus, may be used for real-time monitoring of deposition/removal amount and/or rate under the conditions normally seen by semiconductor wafer in wafer processing tool 102. Accordingly, during the wafer fabrication process, a semiconductor material 406 may be deposited on or removed from wafer 202. Simultaneously, the semiconductor material 406 may be deposited on or removed from sensor surface 408 of micro sensor 208.

At operation 706, a change of the parameter of micro sensor 208 is detected. More particularly, the change of the parameter may be detected when material 406 is deposited on or removed from micro sensor 208 within the second chamber, e.g., process chamber 112. In an embodiment, detecting the change of the parameter includes detecting a shift of a characteristic frequency of micro-resonator 402. In an embodiment, detecting the change of the parameter includes detecting a change of a threshold voltage of a MOSFET 504 of transistor sensor 502. Thus, when micro sensor 208 detects a change in the parameter, a corresponding signal is provided to electronic circuitry 302.

At operation 708, the input signal corresponding to the change in the parameter of the micro sensor 208 may be used to determine an endpoint of the wafer fabrication process. For example, the change in the parameter may correspond to a change in mass 404 of micro-resonator 402. For example, when the wafer fabrication process is a deposition process, an increase in mass 404 from an initial mass 404 to a desired mass 404 may be measured. Similarly, when the wafer fabrication process is an etching process, a decrease in mass 404 from an initial mass 404 to a desired mass 404 may be measured. The change in mass 404 may be identical for every process run of wafer processing tool 102. However, if the change in mass 404 were suddenly more or less, wafer processing tool 102 may determine that a shift in the wafer fabrication process or the process chamber 112 hardware has occurred.

The information about particle contamination may be continuously logged during the wafer fabrication process, and thus, the information may be made available for analysis in real-time or in near real-time. That is, micro sensor 208 and/or wafer processing tool 102 may be connected to other machines in a network to monitor and analyze material deposition and/or removal data using a computer system 104. Thus, progress of the wafer fabrication process may be measured in real-time. Accordingly, computer system 104 may be configured to detect an endpoint of the process when the desired mass 404 is measured.

At operation 710, the wafer fabrication process may be stopped in response to determining the endpoint. For example, when the input signal from micro sensor 208 indicates that the wafer fabrication process has reached a desired process result, e.g., a predetermined value or change in mass 404, electronic circuitry 302 or computer system 104 may determine the endpoint of the wafer fabrication process has been reached, and may stop the deposition or etching process based on the input signal.

Figure 8:
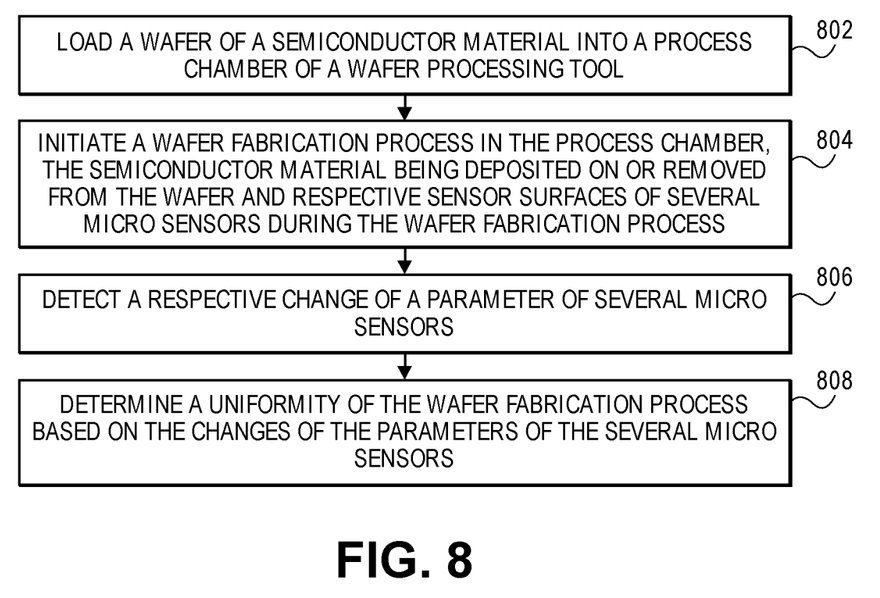
FIG. 8 is an illustration of a flowchart representing operations in a method of determining a uniformity of a wafer fabrication process, in accordance with an embodiment.

Referring to FIG. 8, an illustration of a flowchart representing operations in a method of determining a uniformity of a wafer fabrication process is shown in accordance with an embodiment. By placing several micro sensors 208 in process chamber 112, an instantaneous uniformity, and a uniformity over time, may be detected. More particularly, changes in a deposition or etching rate at different locations in the process chamber 112 may be sensed to determine whether the deposition or etching process differs between those locations.

Operations 802 and 804 may be similar to operations 702 and 704 described above with respect to FIG. 7. That is, wafer 202 may be loaded into process chamber 112 of wafer processing tool 102 and the wafer fabrication process may be initiated. At operation 804, however, the semiconductor material 406 may be deposited on or removed from wafer 202 and respective sensor surfaces 408 of several micro sensors 208 during the wafer fabrication process. That is, deposition or removal of material 406 may be applied to multiple micro sensors 208 in process chamber 112. For example, a first micro sensor 208 may be mounted at a first predetermined location within chamber volume 204, and a second micro sensor 208 may be mounted at a second predetermined location within chamber volume 204. Material may be deposited on or removed from both of the first and second micro sensors 208.

At operation 806, respective changes of the parameters of each micro sensor 208 may be detected. For example, a change of a parameter of the first micro sensor 208 may be detected in response to depositing semiconductor material 406 on or removing semiconductor material 406 from sensor surface 408 of the first micro sensor 208. Similarly, a change of a parameter of the second micro sensor 208 may be detected in response to depositing the semiconductor material 406 on or removing the semiconductor material 406 from sensor surface 408 of the second micro sensor 208. Accordingly, at a given time, the parameters of the first micro sensor 208 and the second micro sensor 208 may be measured.

At operation 808, a uniformity of the wafer fabrication process may be determined based on the measured parameters. For example, changes of the parameters of the several micro sensors 208 may be measured, and the changes may be compared to detect the uniformity. More particularly, when the changes of the parameters are the same or similar within a predetermined degree of variation, e.g., within 5% difference, the wafer fabrication process may be determined to be uniform. When the changes of the parameters vary by a predetermined amount, however, the wafer fabrication process may be determined to be non-uniform. A determination of non-uniformity may trigger an event. For example, a predetermined threshold for a standard deviation between micro sensors 208 in process chamber 112 may be set, and if the threshold is exceeded, an alarm may be triggered and/or wafer processing tool 102 may be stopped from processing a next wafer 202. Data gathered from micro sensors 208 may also be saved to a log file locally or on a remote server for future review, e.g., to aid in root cause analysis. Accordingly, wafer processing tool 102 having micro sensors 208 on process chamber 112 may be used to measure and control process stability.

Figure 9:
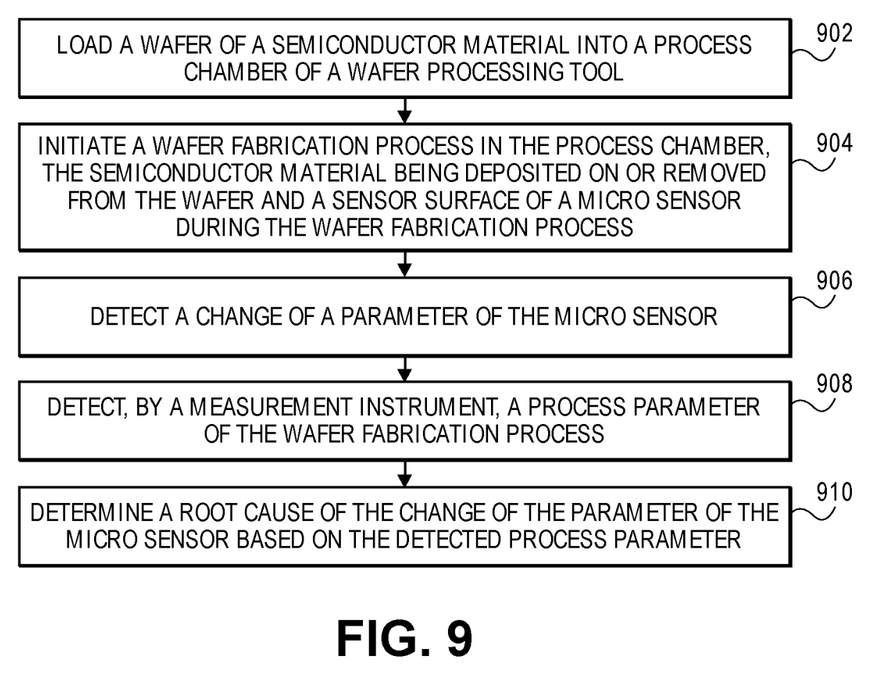
FIG. 9 is an illustration of a flowchart representing operations in a method of determining a root cause of a change of a wafer fabrication process, in accordance with an embodiment.

Referring to FIG. 9, an illustration of a flowchart representing operations in a method of determining a root cause of a change of a wafer fabrication process is shown in accordance with an embodiment. Micro sensors 208 in process chamber 112 of wafer processing tool 102 may be used to determine a root cause of a change to a deposition or removal rate. For example, micro sensors 208 may be correlated to other machine sensors to identify a likely cause of a change in deposition or removal rates. In an embodiment, micro sensor 208 is correlated to a measurement instrument, e.g., an optical spectrometer 216. Alternatively, micro sensor 208 may be correlated to other machine sensors, such as sensors used to detect temperature, power delivered to process chamber 112, gas concentration, or ion density of process chamber 112.

Operations 902 through 906 may be similar to operations 702 through 706 described above with respect to FIG. 7. That is, wafer 202 may be loaded into process chamber 112 of wafer processing tool 102 and the wafer fabrication process may be initiated. Furthermore, a change of a parameter of micro sensor 208 may be detected.

At operation 908, a process parameter of the wafer fabrication process may be detected and/or measured by a measurement instrument. For example, the measurement instrument may include optical spectrometer 216 described above with respect to FIG. 2. Accordingly, the process parameter may be an OES signature of chamber volume 204 as measured by optical spectrometer 216.

At operation 910, a root cause of the change of the parameter of micro sensor 208 may be determined based on the detected process parameter. For example, the change of the parameter of the micro sensor 208 may occur simultaneously or near in time to a change of the process parameter measured by the measurement instrument. The process parameter may be a concentration of a particular gas, and the change of the process parameter may indicate an increase in the concentration. Accordingly, the concurrent changes may indicate that an increase in the gas concentration is a root cause for the change in the parameter of the micro sensor 208, e.g., the root cause for a change in the deposition rate or the removal rate of material 406 on micro sensor 208. Wafer processing tool 102 may then be adjusted or repaired to maintain the gas concentration and the deposition/removal rates within a desired range. Accordingly, wafer processing tool 102 having micro sensors 208 on process chamber 112 may be used as a troubleshooting tool.

In an embodiment, micro sensors 208 may be used over numerous process runs, and thus, micro sensors 208 may be self-calibrating to adjust for the deposition or removal of material 406 from sensor surface 408. For example, electronic circuitry 302 or computer system 104 may be configured to calibrate micro sensor 208 after each process run. As material 406 is deposited on or removed from sensor surface 408 during the wafer fabrication process, the parameter of micro sensor 208 may increase or decrease. For example, mass 404 of micro resonator may increase after a deposition process, and thus, the characteristic frequency of micro resonator may change from a first value to a second value. Prior to beginning a subsequent deposition process, electronic circuitry 302 or computer system 104 may set the second value as an initial value in the next process run. Accordingly, the change in the parameter during the next process run may be accurately measured.

Sensor surface 408 may be periodically cleaned or replaced to ensure that a sensitivity and a reliability of micro sensor 208 is not compromised. For example, when micro sensor 208 monitors a deposition process, periodic cleaning of micro sensor 208 may be performed to remove material 406 that is deposited over time. Micro sensor 208 could be cleaned in situ, without opening process chamber 112, to extend the life of micro sensor 208. For example, a plasma or radical may be introduced into process chamber 112 to clean material 406 from sensor surface 408. That is, if material 406 is silicon, then fluorine radicals may be introduced to clean the silicon from sensor surface 408.

Micro sensors 208 may be replaced on a predetermined periodicity. For example, when micro sensors 208 are used to monitor an etching process, sensor surface 408 may be consumed over time. Thus, micro sensors 208 may be replaced when a predetermined amount of material, e.g., top layer 412, has been removed from micro sensor 208.

Figure 10:
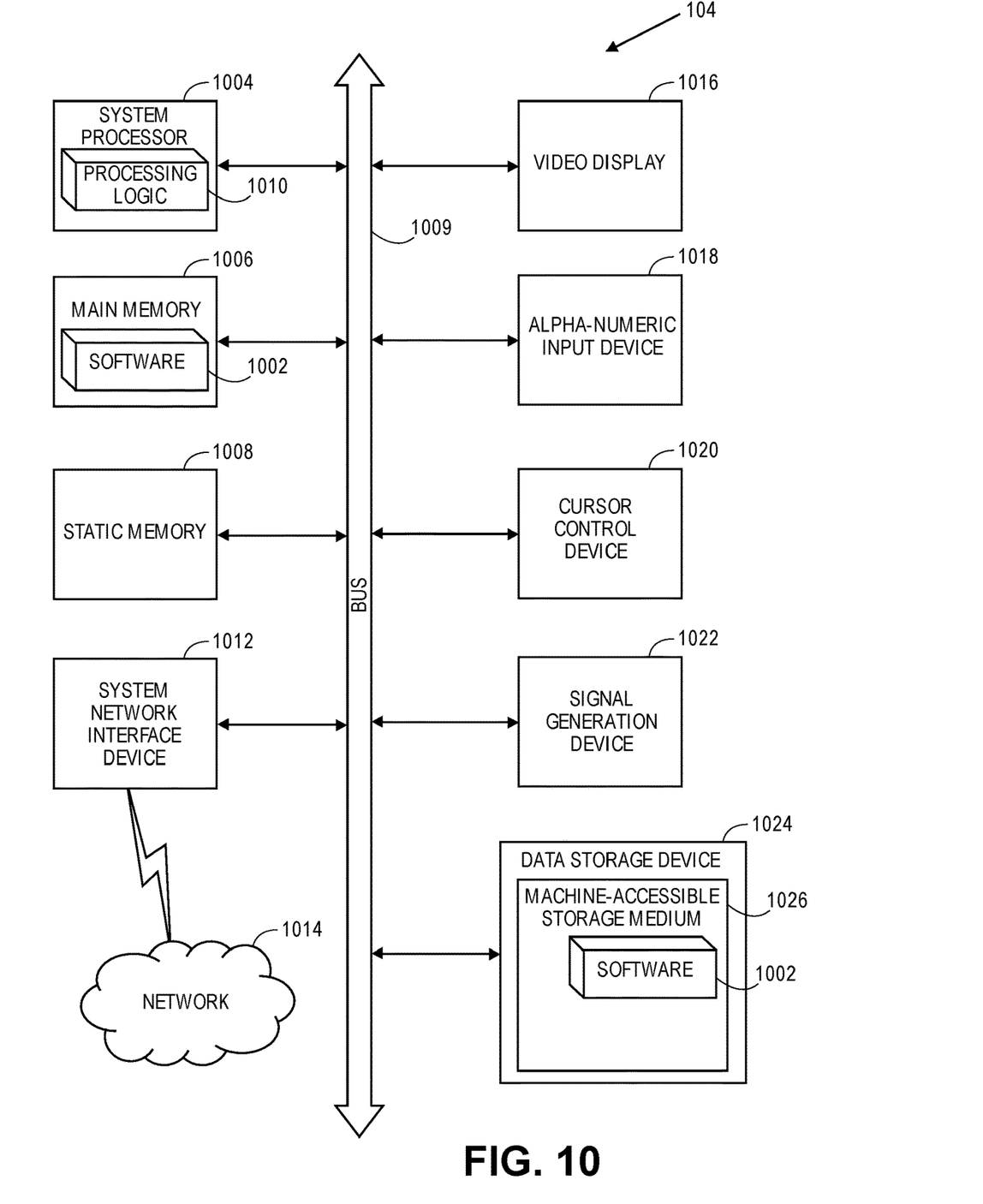
FIG. 10 illustrates a block diagram of an exemplary computer system of a wafer processing system, in accordance with an embodiment.

Referring to FIG. 10, a block diagram of an exemplary computer system of a wafer processing system is shown in accordance with an embodiment. One or more components of the illustrated computer system 104 may be used in electronic circuitry 302 of wafer processing tool 102. Accordingly, electronic circuitry 302 discussed above with respect to FIG. 3 may be a subset of computer system 104. Alternatively, electronic circuitry 302 may be local to wafer processing tool 102 and computer system 104 may be a fabrication facility host computer that is interfaced with electronic circuitry 302 and/or a computer of wafer processing tool 102. In an embodiment, computer system 104 is coupled to and controls robots, load locks 110, process chambers 112, and other components of wafer processing tool 102. Computer system 104 may also receive and analyze material deposition/removal information provided by micro sensors 208 as described above.

Computer system 104 may be connected (e.g., networked) to other machines in a Local Area Network (LAN), an intranet, an extranet, or the Internet. Computer system 104 may operate in the capacity of a server or a client machine in a client-server network environment, or as a peer machine in a peer-to-peer (or distributed) network environment. Computer system 104 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 104, the term "machine" shall also be taken to include any collection of machines (e.g., computers) that individually or jointly execute a set (or multiple sets) of instructions to perform any one or more of the methodologies described herein.

Computer system 104 may include a computer program product, or software 1002, having a non-transitory machine-readable medium having stored thereon instructions, which may be used to program computer system 104 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 104 includes a system processor 1004, a main memory 1006 (e.g., read-only memory (ROM), flash memory, dynamic random access memory (DRAM) such as synchronous DRAM (SDRAM) or Rambus DRAM (RDRAM), etc.), a static memory 1008 (e.g., flash memory, static random access memory (SRAM), etc.), and a secondary memory (e.g., a data storage device 1024), which communicate with each other via a bus 1009.

System processor 1004 represents one or more general-purpose processing devices such as a microsystem processor, central processing unit, or the like. More particularly, the system processor 1004 may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1004 may also be one or more special-purpose processing devices such as an application specific integrated circuit (ASIC), a field programmable gate array (FPGA), a digital signal system processor (DSP), network system processor, or the like. System processor 1004 is configured to execute the processing logic 1010 for performing the operations described herein.

The computer system 104 may further include a system network interface device 1012 for communicating with other devices or machines, e.g., wafer processing tool 102, over a network 1014. The computer system 104 may also include a video display unit 1016 (e.g., a liquid crystal display (LCD), a light emitting diode display (LED), or a cathode ray tube (CRT)), an alphanumeric input device 1018 (e.g., a keyboard), a cursor control device 1020 (e.g., a mouse), and a signal generation device 1022 (e.g., a speaker).

The secondary memory may include a data storage device 1024 having a machine-accessible storage medium 1026 (or more specifically a computer-readable storage medium) on which is stored one or more sets of instructions (e.g., software 1002) embodying any one or more of the methodologies or functions described herein. The software 1002 may also reside, completely or at least partially, within the main memory 1006 and/or within the system processor 1004 during execution thereof by the computer system 104, the main memory 1006 and the system processor 1004 also constituting machine-readable storage media. The software 1002 may further be transmitted or received over a network 1014 via the system network interface device 1012.

While the machine-accessible storage medium 1026 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method, comprising:
   loading a wafer into a process chamber of a wafer processing tool, wherein the process chamber includes a chamber volume and a micro sensor mounted on the process chamber at a predetermined location within the chamber volume, wherein the micro sensor has a parameter and includes an initial sensor surface, the initial sensor surface consisting of a silicon surface, and wherein the parameter changes when silicon is deposited on or removed from the initial sensor surface;
   initiating a wafer fabrication process in the process chamber, wherein silicon is deposited on or removed from the wafer and the sensor surface during the wafer fabrication process; and
   detecting a change of the parameter of the micro sensor in response to depositing the silicon on or removing the silicon from the sensor surface.

2. The method of claim 1, wherein the chamber volume is plasma-less when the silicon is deposited on or removed from the sensor surface during the wafer fabrication process.

3. The method of claim 2, wherein detecting the change of the parameter includes detecting a shift of a characteristic frequency of a micro-resonator.

4. The method of claim 2, wherein detecting the change of the parameter includes detecting a change of a threshold voltage of a MOSFET.

5. The method of claim 1, further comprising:
   determining an endpoint of the wafer fabrication process based on the change of the parameter of the micro sensor; and
   stopping the wafer fabrication process in response to determining the endpoint.

6. The method of claim 1, wherein the wafer processing tool includes a second micro sensor mounted on the process chamber at a second predetermined location within the chamber volume, and further comprising:
   detecting a second change of a second parameter of the second micro sensor in response to depositing the silicon on or removing the silicon from a second sensor surface; and
   determining a uniformity of the wafer fabrication process based on the change of the parameter of the micro sensor and the second change of the second parameter of the second micro sensor.

7. The method of claim 1, further comprising:
   detecting, by a measurement instrument, a process parameter of the wafer fabrication process; and
   determining a root cause of the change of the parameter of the micro sensor based on the detected process parameter.

8. The method of claim 7, wherein the measurement instrument includes an optical spectrometer, and wherein the process parameter includes an optical emissions spectrometry signature of the chamber volume.

9. A non-transitory machine-readable medium having stored thereon instructions to perform a process, the process comprising:
   loading a wafer into a process chamber of a wafer processing tool, wherein the process chamber includes a chamber volume and a micro sensor mounted on the process chamber at a predetermined location within the chamber volume, wherein the micro sensor has a parameter and includes an initial sensor surface, the initial sensor surface consisting of a silicon surface, and wherein the parameter changes when silicon is deposited on or removed from the initial sensor surface;
   initiating a wafer fabrication process in the process chamber, wherein silicon is deposited on or removed from the wafer and the sensor surface during the wafer fabrication process; and
   detecting a change of the parameter of the micro sensor in response to depositing the silicon on or removing the silicon from the sensor surface.

10. The non-transitory machine-readable medium of claim 9, wherein the chamber volume is plasma-less when the silicon is deposited on or removed from the sensor surface during the wafer fabrication process.

11. The non-transitory machine-readable medium of claim 10, wherein detecting the change of the parameter includes detecting a shift of a characteristic frequency of a micro-resonator.

12. The non-transitory machine-readable medium of claim 10, wherein detecting the change of the parameter includes detecting a change of a threshold voltage of a MOSFET.

13. The non-transitory machine-readable medium of claim 9, the process further comprising: determining an endpoint of the wafer fabrication process based on the change of the parameter of the micro sensor; and stopping the wafer fabrication process in response to determining the endpoint.

14. The non-transitory machine-readable medium of claim 9, wherein the wafer processing tool includes a second micro sensor mounted on the process chamber at a second predetermined location within the chamber volume, and the process further comprising:
   detecting a second change of a second parameter of the second micro sensor in response to depositing the silicon on or removing the silicon from a second sensor surface; and determining a uniformity of the wafer fabrication process based on the change of the parameter of the micro sensor and the second change of the second parameter of the second micro sensor.

15. The non-transitory machine-readable medium of claim 9, the process further comprising:
detecting, by a measurement instrument, a process parameter of the wafer fabrication process; and determining a root cause of the change of the parameter of the micro sensor based on the detected process parameter.

16. The non-transitory machine-readable medium of claim 15, wherein the measurement instrument includes an optical spectrometer, and wherein the process parameter includes an optical emissions spectrometry signature of the chamber volume.

* * * * *